United States Patent [19]

Kamaishi et al.

[11] Patent Number: 4,500,587
[45] Date of Patent: Feb. 19, 1985

[54] GRAPHIC ARTS FILM AND METHOD OF PREPARING SAME

[75] Inventors: Tadami Kamaishi, Otsu; Takao Kitagawa, Shiga, both of Japan

[73] Assignee: Toray Industries, Incorporated, Tokyo, Japan

[21] Appl. No.: 433,668

[22] Filed: Oct. 12, 1982

[30] Foreign Application Priority Data

Oct. 14, 1981 [JP] Japan ................ 56-162696

[51] Int. Cl.$^3$ .......... B32B 3/18; B32B 9/04; B41M 5/20
[52] U.S. Cl. .................. 428/204; 101/457; 101/467; 428/205; 428/447; 430/49; 430/54; 430/97; 430/117; 430/120
[58] Field of Search ........... 428/195, 447, 204, 205; 101/457, 467; 430/49, 54, 97, 117, 120

[56] References Cited

U.S. PATENT DOCUMENTS 4,020,761  5/1977  Ogiwara et al. ............ 101/457
4,259,905  4/1981  Abiko et al. ............... 101/467
4,308,799  1/1982  Kitagawa et al. ........... 428/447 X

FOREIGN PATENT DOCUMENTS 1458724  12/1976  United Kingdom ............ 101/457

OTHER PUBLICATIONS

English Translation of Claim for Japanese Laid Open No. 130934, Oct. 11, 1979.

*Primary Examiner*—Thomas J. Herbert
*Attorney, Agent, or Firm*—Scully, Scott, Murphy & Presser

[57] ABSTRACT

The present invention relates to a graphic arts film obtained by forming a toner image on a light-transmitting base sheet having a toner-adhesive and ink-repellent coating layer, then fixing the toner image and applying ink onto the surface of the base sheet to thereby selectively enhance the optical density of the toner image area on the coating layer, and a method of preparing the same.

The present invention permits easy and inexpensive production of a graphic arts film having a sufficiently enhanced optical density, free from pin-holes and capable of being retouched with respect to the image formed thereon.

20 Claims, No Drawings

GRAPHIC ARTS FILM AND METHOD OF PREPARING SAME

BACKGROUND OF THE INVENTION

The present invention relates to a graphic arts film or a process film. More particularly, it is concerned with a graphic arts film or a process film with toner image formed on a light-transmitting base sheet having a toner-adhesive and ink-repellant, transparent coating layer formed thereon.

There are known graphic arts films comprising a transparent base sheet and a light sensitive compound which eventually leads to an increase in the optical density of image and which has been applied onto the base sheet in the form of a uniform or non-uniform layer. For example, there are known (a) a panchromatic black-and-white film prepared by dispersing fine particles consisting mainly of fine silver halide particles in gelatin and applying the resultant dispersion onto a film, (b) a diazo film prepared by mixing a light sensitive diazo-compound as a main component intimately with resins and applying the resultant composition onto a film, and (c) a photo-polymer film prepared by applying a photo-polymerizable monomer or photo-polymer, a colored pigment and other resin onto a film uniformly with respect to the plane of the film and uniformly or laminatedly in the direction perpendicular to the film surface. All of these films have superior points in performance, cost, etc. and have long been practically used or are being put to practical use.

It has also been proposed to form a toner image on, for example, a transparent film or translucent paper by electrophotography to obtain a graphic arts film or a positive film for line work.

However, those conventional films are not always free from problem. For example, in the case of the silver salt film, due to the recent decrease of silver resources, the cost of silver has remarkably increased and is greatly affecting the manufacturing cost of the film. In point of performance, moreover, the image density may lower in retouching (dot-etching) or in the case of first preparing a negative film from a positive film and further preparing a positive film using the negative film prepared. Other problems involve the presence of pin-holes, impossibility of a perfect daylight processing, and a long time required for development, fixing and drying.

In the case of the diazo film, it is advantageous in point of cost, but in point of performance it involves inconveniences such as an insufficient optical density and inapplicableness of retouching of imaginary part by dot-etching or the like, and therefore its application range is limited. Furthermore, in the case of the coated film comprising a photopolymerizable material and a colored pigment, its full-scale practical application involves problems such as the difficulty of retouching of imaginary part and an insufficient shelf life of the film.

In the case of using electrophotography, moreover, not only the density of toner image formed on the film is insufficient and non-uniform, but also, for example when retouching the image toner by dissolution, the optical density of the toner image further lowers to the extent it is difficult to use the film as a graphic arts film.

The present invention provides an imaged film free from the above-mentioned problems.

SUMMARY OF THE INVENTION

It is an object of the present invention to provide an inexpensive graphic arts film and a method of preparing the same.

It is another object of the present invention to provide a graphic arts film capable of undergoing a daylight processing, free from drawbacks such as pin-holes and having an enhanced optical density, and a method of preparing the same.

It is a further object of the present invention to provide a method of selectively enhancing the optical density of only the image area in the case of forming the toner image on a light-transmitting base sheet by electrophotography.

More specifically, the present invention relates to a graphic arts film comprising a light-transmitting base sheet, a toner-adhesive and ink-repellent, transparent coating layer formed on the base sheet, a toner bonded imagewise onto the transparent coating layer, and an ink layer formed selectively on only the toner image area, as well as a method of preparing a graphic arts film which method comprises forming a toner-adhesive and ink-repellent, transparent coating layer on a light-transmitting base sheet, bonding a toner imagewise onto the transparent coating layer, and applying ink onto the imaged sheet to thereby selectively enhance the optical density of the toner image area formed on the transparent coating layer.

DESCRIPTION OF THE PREFERRED EMBODIMENTS

The present invention is concerned with a graphic arts film obtained by inking a light-transmitting base sheet to thereby selectively enhance the optical density of a toner image area formed thereon.

The light-transmitting base sheet is, for example, a light-transmitting, transparent base sheet and having a light transmissivity not less than 50%, preferably not less than 70%. For example, it comprises a high polymer film or sheet, which may be a single layer or a composite.

As polymer for the light-transmitting base sheet, there may be used, for example, polyester, polyamide, crystalline polyolefin, polystyrene, ionomer, polycarbonate, polyphenylene sulfide, polysulfone, polyvinyl chloride, cellulose, acetylcellulose, polyimide, and copolymer thereof. These film bases may be suitably coated with other resin, metal or compound. As the light-transmitting base sheet, there may be employed, in addition to a glass-like sheet, a resin-soaked and hardened, organic or inorganic cloth or paper sheet, or a sheet obtained by flattening the polymer under high pressure. Particularly, polyester, polyamide, polyolefin and cellulose films are preferred.

The light-transmitting base sheet itself may have a multi-layer structure, or it may have a light sensitive property as function. For example, there may be used an electrophotographic photoreceptor comprising laminated ohmic layer and photosensitive layer having photo-conductivity, or a photosensitive (photo-setting, photo-degrading, photo-conductive) film itself.

As the transparent coating layer to be applied onto the light-transmitting base sheet, there may be used anything if only it can form a toner-adhesive and ink-repellent coating. As the coating layer having such a property, elastomeric silicone resins are preferably used. Particularly preferred are elastomeric silicone resins containing at least one member bonded in the molecule thereof selected from O, N, S, P elements, Na, K, Zn, Fe, Ti, Zr, various other metal elements, aromatic rings having not more than 18 carbon atoms and heterocyclic rings having not more than 18 carbon atoms, other than —Si—O— bond inherent to the starting material.

Various elastomeric silicone resins are employable as the coating layer used in the invention, for example:

(1) A composition containing the following three components as essential components: an organopolysiloxane, an alkoxy silane containing one or more polar groups, and an organotitanium or organozirconium compound containing metal-oxygen bond, as disclosed in U.S. Pat. No. 4,308,799 (the corresponding Japanese Patent Application No. 138150/1979), and more specifically a silicone resin comprising a mixture of (A) an organopolysiloxane, (B) an alkoxy silane represented by the formula $R_{4-a-b}R'_aSi(OR'')_b$ wherein R is an organic group having 1 to 18 carbon atoms which contains a member selected from the group consisting of an olefinically unsaturated hydrocarbon group, an aromatic hydrocarbon group and a polar group which does not react with the OR'' at room temperature, R' is an alkyl or alicyclic group having 1 to 18 carbon atoms, OR'' is an alkoxy group having 1 to 8 carbon atoms, a is 0 or 1, b is 2 or 3, and a+b is at most 3, and (C) a titanium or a zirconium compound represented by the formula $(R^1O)(R^2O)(R^3O)(R^4O)M$ wherein $R^1$, $R^2$, $R^3$, $R^4$ are each an organic group having 1 to 18 carbon atoms or an organic group having 1 to 18 carbon atoms containing a residue of

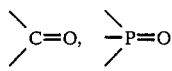

or

by which the group is bonded to the oxygen atom, and M is titanium or zirconium;

(2) A silicone resin consisting mainly of a reaction product obtained by reacting, in the presence of a catalyst, a polymer having at least two hydroxyl groups per molecule with a terminal hydroxyl group-containing organopolysiloxane, as disclosed in U.S. Pat. No. 4,259,905 (the corresponding Japanese Patent Laid Open Publication No. 163101/1979);

(3) A solidified silicone composition having organosiloxane units containing a reactive organic group, as disclosed in Japanese Patent Publication No. 42286/1979;

(4) A solidified organopolysiloxane composition containing phenyl group, as disclosed in U.S. Pat. No. 4,020,761 (the corresponding Japanese Patent Publication No. 19755/1980);

(5) A hetero-phase polymer composition containing a copolymer obtained by copolymerization of an organic non-silicone component block and a siloxane polymer block, as disclosed in British Pat. No. 1,458,724 (the corresponding Japanese Patent Laid Open Publication No. 1803/1975);

(6) A metal ion-crosslinked silicone polymer obtained by reaction between metal ion and carboxyl groups containing silicone, as disclosed in Japanese Patent Laid Open Publication No. 76104/1981; and (7) A photo-polymerized organopolysiloxane containing nitrogen and halogen atoms in its groups, as disclosed in Japanese Patent Laid Open Publication No. 116304/1977.

Moreover, in a sense somewhat different from the above compositions, a film wherein a silicone and a crosslinking agent have not been fully reacted through reactive groups, that is, an uncured or insufficiently cured film, exhibits a fairly good toner adhesiveness. Therefore, even polysilocanes which when cured completely exhibits little toner adhesiveness are included in the scope of the present invention in case they are coatings in an insufficiently cured state as just mentioned above (even if cured after bonding of toner the toner bonding strength is maintained). As an example, ention may be made of U.S. Pat. No. 3,951,063 (the corresponding Japanese Patent Publication No. 45523/1977). It is presumed that in the case of a coatings in an insufficiently cured state, there remain reactive groups which ought to be lost by curing and they act as an adhesive component.

The above-mentioned compositions are selected with their adhesion to toner as a guideline. Compositions having only a small affinity for toner are not suitable to the present invention. For example, silicone resins which are extremely superior in ink repellency but extremely poor in toner adhesiveness, are not preferable in the present invention. In practical use, it is important for the coating layer used in the present invention to have sufficient durability and manufacturing reproducibility, and in this sense, the coating layer comprising the composition (1) among the foregoing compositions is preferable because it is superior in toner adhesiveness, durability and manufacturing reproducibility. The finer the image, the more important becomes the toner adhesiveness. Therefore, a high toner adhesiveness is desired in order to obtain an image of high resolution. In general, ink-repellent silicone resins repel ink and keep it off, and so their capability of bonding materials is very low.

In order to have such silicone resins exhibit a toner adhesiveness, it is preferable to use a layer, as the ink-repellent coating layer, to which a toner to be bonded adheres well.

As to the manufacturing reproducibility, it is preferable that at the time of production the coating layer be not so sensitive to the atmospheric moisture and oxygen or to the change in curing temperature, and be difficult to deteriorate in its toner adhesiveness and ink repellency with the lapse of time and difficult to be flawed on its surface.

The graphic arts film of the present invention is obtained by forming a toner image by electrophotography on the surface of a light-transmitting base sheet having a toner-adhesive and ink-repellent coating layer, then fixing the toner and thereafter applying ink to the film. The ink adheres selectively to only the image area without its adhesion to non-image area because of ink repellency of the latter, and the optical density of only the image area can thereby be enhanced.

The film of the present invention, as a litho film, is entirely different from conventional litho films in that it is provided with the toner-adhesive and ink-repellent coating layer.

The following description is now provided about the method of producing the graphic arts film of the present invention.

First, the light-transmitting base sheet having a toner-adhesive and ink-repellent coating layer is prepared by dissolving or uniformly dispersing, for example, any of the foregoing coating layer compositions in an organic solvent, then applying the resulting solution or dispersion onto a light-transmitting base sheet by using a known application method, followed by drying. As the application method, there may be adopted, for example, the slit die coating method, the roll coating method or the spray coating method.

After application onto the base sheet, the composition is dried to remove solvent and, if required, subjected to a further heat treatment, whereby there is obtained the coated film. The heat treatment temperature ranges, for example, from 80° to 200° C. and preferably 100° to 180° C., and the treatment time may be chosen suitably according to the base material used. The application thickness of the composition ranges from 0.1 to 100μ, preferably 0.3 to 10μ, in terms of thickness after drying. Furthermore, the light-transmitting base sheet may be treated beforehand with an adhesive, or surface-treated, for example, its surface may be rendered uneven physically finely, in order to enhance its adhesion to the coating layer.

Then, a toner image is formed on the surface of the so-prepared coated film. For example, in case the film has a photo-conductive layer, the image is formed through the steps of corona charge, image exposure and toner development (the so-called CPC system) directly in known manner or by using a commercially available machine. In case the film does not have a photo-conductive layer, a transferred image is formed by means of an electrophotographic copying machine or plate making machine according to the PPC system, and the toner image is fixed in known manner, for example, by the application of heat or pressure. Preferably, the fixing by heat is carried out at a temperature in the range of 50° to 300° C.

As the toner, there may be used positive- or negative-charging, wet or dry fine particles according to the electric charge on the photo-conductive layer. The toner may be colored by known coloring matters, including pigments and dyes, but it may be substantially colorless. The particle size of toner used is decided according to the required quality of image and the image accuracy of a photosensitive substrate. Wet toner is preferable to dry toner because it average particle size is smaller and thus suitable for an image of high resolution. Particularly preferred is a toner having an average particle size not larger than 5 microns.

Preferred examples of resins for toner include modified epoxy resins and acrylic copolymer resins which easily form a dispersion in a non-aqueous solvent. As epoxy resins, there may be used, for example, the reaction product of bisphenol A and epichlorohydrin, and those having properties different from bisphenol A such as one obtained by substituting bisphenol A by novolak and those obtained by introducing epoxy groups by using peracetic acid to unsaturated groups of unsaturated compounds such as cyclopentadiene and cyclohexene derivatives, polybutadiene and drying oils. Particularly preferred are those obtained by reaction of bisphenol A and epichlorohydrin and having a molecular weight ranging from about 360 to 8,000, an average degree of polymerization not greater than about 20 and an epoxy equivalent ranging from 400 to 4,000.

As modifying agents for the epoxy resins there may be used organodicarboxylic acids having not more than 20 carbon atoms and dialcohols having not more than 20 carbon atoms.

Preferred examples of acrylic resin copolymers are graft or block copolymers containing in the molecule a lipophilic long chain group for facilitating the dispersion in a non-aqueous solvent, particularly in a hydrocarbon solvent with low polarity. More specifically, copolymers of acrylic or methacrylic acid esters with unsaturated vinyl monomers such as styrene, vinyl acetate and vinyl chloride, are used preferably.

It is preferable that the bonding strength of toner to the coating layer be not lower than 20 g/cm. This bonding strength may be measured in the following manner. First, a toner powder or a dispersion of toner particles in a solvent is applied uniformly onto the coated film used in the present invention which has an ink-repellent layer formed on a base sheet, then dried and fixed, thereafter a paper is sticked onto the surface of the fixed toner by using an adhesive and a sample 1 cm wide is prepared, which is peeled off by means of a tension tester to determine the bonding strength.

Retouching of toner image, if required, may be made before fixing of the toner, but for a more complete retouching, it is performed after fixing of the toner. Toner contamination and unnecessary image portions can be removed easily in known manner, for example, by blow-inhalation of air, adsorption by a sticky material, or wiping off by using a solvent-absorbed cotton-like material. Retouching of the toner image by dot-etching is performed by using a toner-dissolving or -swelling solvent. Solvents which dissolve toner to a moderate extent are preferred, and solvents employable for dot-etching the toner image may be used alone or as a mixture, for example, acetone alone or combinations thereof with water, butanol, methyl cellosolve, etc., depending on the resin which constitutes the toner. The toner image after retouching exhibits thinning of lines, reduction in thickness of the toner layer and decrease in its density because of dissolving-out of toner. This phenomenon has heretofore been considered to be a serious problem difficult to be solved, but in the present invention it causes no problem. In the present invention, this drawback can be overcome by the application of ink. That is, after removing the retouching solvent thoroughly from the retouched film, ink is applied to the film to enhance the optical density of the toner image area.

In general, the application of ink is effected by transferring ink which has been kneaded by ink roller onto inking roller and feeding the ink therefrom onto the surface of the film with toner image formed thereon. The inking roller is brought into rotating contact, at least once and usually two to thirty times or so, with the imaged film surface so that the film surface may fully repel the ink at its non-image area and allow adhesion thereto of the ink sufficiently at its image area. This inking operation may be performed by using a manual roller.

By applying ink in this way, the optical density of the toner image area, no matter how low it may be before application of ink, is improved to not less than 2.5, preferably 3 to 4. By the adhesion of ink, unevenness of the toner image is flattened, and pin-holes, if any, are filled with ink and so disappear. Preferably, the ink layer thus has an average thickness in the range of 0.2 to 10 microns.

The ink to be used may be chosen suitably from among commercially available inks, but those which are easily repelled by the coating layer used in the present invention, are preferred. There may be used not only inks which dry in the air, but also those which solidify by dry heat through ultraviolet ray, infrared ray or a mere heat. Inks for planographic printing and those for relief printing both are employable, but inks designed for dry planographic printing are preferred. Inks for offset printing requiring fountain solution include those which are employable in the present invention and whose ink repellency may be improved by the addition thereto of a small amount of silicone oil. Inks which may be used in the present invention preferably have a viscosity not lower than 20 poise at room temperature.

Even after application of ink and its drying treatment, retouching of image can be effected. Since the toner is easily dissolved or swollen by the solvent, it is possible to effect retouching by dot-etching even if the surface ink has been insolubilized by polymerization. After the retouching, ink may be applied again if required.

The film having the toner-adhesive and ink-repellent coating layer formed thereon which serves as a graphic arts film or an optical mask may have a transparent photosensitive layer having photo-conductivity formed under the coating layer, or it may be free from photo-sensitivity and toner image may be formed thereon by transferring using an electrophotographic copier. In the former case, the top layer is an electric insulating layer, and the formation of image may be performed by a known method involving, for example, a primary charging by corona discharge, a subsequent or simultaneous image exposure, and a subsequent secondary charging opposite to the primary charging and development. As the photo-conductive layer; there may be used a layer comprising a conductive substrate and a crystalline CdS thinner than 1 micron, preferably from 0.2 to 0.8 micron, deposited thereon by Radio Frequency sputtering (this transparent sheet is what is called "KC film"); an organic photo-semiconductor film such as a deposited layer of selenium or a film formed of polyvinylcarbazole or a derivative thereof; or a suitable combined laminate thereof.

The direct formation of toner image on the coated film having the photo-conductive layer is considered to provide a highly accurate image, but even the transferring method using an electrophotographic copier can afford an image of extremely high quality by selecting a photosensitive substrate of high accuracy for the formation of image. For example, "KC plate", developed by Coulter Systems Co., invented by Manfred R. Kuehnle and disclosed in U.S. Pat. No. 4,025,339, has a very high resolution and permits the formation of transferred image to an extent comparable to a silver salt litho film. The "KC plate" consists of a conductive substrate and a coating thinner than 1 micron, preferably from 0.2 to 0.8 micron, formed thereon from fine and uniform anisotropic single crystals. The most preferable electrophoto-conductive layer is a coating on an ohmic layer in which extremely pure CdS single crystals formed almost completely stoichiometrically are arranged regularly. The CdS single crystal is a crystal of hexagonal system about 3,500 Å thick and about 700 Å wide, with the crystallographic axis being vertical to the plate surface and regularly and uniformly arranged.

There are various sizes of wet toners, including those which, as the case may be, cannot make the most of the accuracy of a photosensitive substrate. Even those having an average particle size of 0.1 micron or less are employable, which is comparable to or even smaller than silver halide particles in silver salt films. In case the size of toner does not define the image accuracy, the resolution of a photosensitive substrate or that of lenses defines it.

As will be apparent from the above description, the present invention relates to a litho film obtained by forming a highly toner-adhesive and ink-repellent coating layer on a light-transmitting base sheet, then forming a toner image thereon by, for example, electrophotography, thereafter fixing the toner image and subsequently applying ink to the coating layer, allowing the ink to adhere selectively to the toner image area, thereby improving the image density. According to the present invention, a graphic arts film free from defects such as pin-holes and having an enhanced optical density can be produced extremely simply and that inexpensively.

The following examples are given to further illustrate the present invention, but the invention is not limited thereto.

EXAMPLE 1

An ink-repellent and toner-adhesive silicone coating layer was formed on a polyethylene terephthalate base film, and then a toner image was formed on the coated film.

(1) Preparation of the Film having the Silicone Coating Layer

A polyethylene terephthalate film ("Lumirror" T type, 100μ, a product of Toray Industries, Inc.) was used as a base sheet, onto which was applied a silicone solution to prepare a coated film. The silicone solution was of the following composition:

a. Dimethyl polysiloxane (a product of Toray Silicone Co., containing hydroxyl groups at both ends, having an average molecular weight of 22,000): 100 parts b. γ-Glycidoxypropyl trimethoxy silane (SH6040, a product of Toray Silicone Co.): 20 parts c. Di-i-propoxytitanium bisacetylacetonate (Titabond-50", a product of Nippon Soda Co.): 5 parts d. Hydrocarbon solvent "Iso Par E" (a product of Esso Chemical Co.): 1,125 parts This coating solution was applied onto the polyethylene terephthalate film by means of a bar-coater so as to give a thickness after drying and curing of 3.0 micron, then "Iso Par E" was removed by drying at room temperature, followed by further curing at 160° C. for 5 minutes, to obtain a unimaged coated film.

(2) Image Formation

Electrophotographic copiers "Xerox 3207" and "Canon NP-8" were used for the formation of dry image and of wet image, respectively. Both copying machines are of a system (PPC) involving formation of a toner image on a photosensitive drum and subsequent transferring of the toner image.

For the copier "Canon NP-8" there was used a wet toner made of a modified epoxy resin having adhesiveness to the silicone surface, and for the dry type "Xerox 3207" there was used a toner available specially for this machine. In both cases, there were obtained ordinary PPC images.

(3) Image Retouching and Dot Etching

The image area on the sheet coming out of the aforesaid copying machines is not always heat-fixed to a satisfactory extent. Therefore, the toner image was further subjected to heat fixing at 160° C. for 1 minute. Then, retouching and dot etching were applied to unnecessary image portions, shadows and background contamination by using a mixed acetone-ethanol solvent.

As a result of the above operation, it was confirmed clearly that the dot size of the toner image was reduced and that the optical density of the retouched dots became lower than that before retouching.

(4) Improvement in Optical Density of Image by the Application of Ink

The optical density of the toner image after retouching was enhanced by applying ink to the film. First, the film was attached to a printing machine "A. B. Dick 309" (a product of A. B. Dick Co.) and then a commercially available ink "Schmidt H" (a product of Schmidt Printing Ink Co.) was applied to the toner image area 20 times at a revolution rate of 100 rpm (a form roller with ink contacted the image surface 20 times). After application of the ink, the film was removed from the printing machine and then heated in an oven to dry the ink. The image area of the film of the present invention thus prepared showed the following values of optical densities before and after application of the ink.

| Image portions of different optical densities | Optical density of toner image after retouching | |
|---|---|---|
| | Before application of ink | After application of ink |
| a | 0.30 | above 4 |
| b | 0.40 | 3.96 |
| c | 0.46 | above 4 |
| d | 0.50 | " |
| e | 0.98 | " |
| f | 1.87 | " |
| g | 2.25 | " |
| h | 2.93 | " |

From the results set out in the above table it is seen that no matter how low the optical density of image may be before application of ink, it is remarkably enhanced by the application of ink, and that the so-treated film exhibits a satisfactory optical performance as a graphic arts film or as an optical mask.

Fine pin-holes proved to disappear by being filled and coated with the ink, although this depends on the hardness of ink.

The non-image area exhibited a sufficient ink-repellency, and background contamination caused by ink was not observed.

EXAMPLE 2

The following composition was applied onto the same polyethylene terephthalate film "Lumirror", then dried and cured to obtain a film having a coating layer formed thereon:

a. Dimethyl polysiloxane (same as that used in Example 1): 10 parts
b. 1,2-Polybutadiene ("G-3000", a product of Nippon Soda Co., having an average molecular weight of 3,000 and a 1,2-bond content of above 90% and containing hydroxyl groups at both ends): 90 parts
c. Mixture of ethyl triacetoxy silane and methyl triacetoxy silane (a product of Toray Silicone Co.): 6 parts
d. Dibutyltin diacetate: 0.12 part
e. Hydrocarbon solvent "Iso Par E" (a product of Esso Chemical Co.): 900 parts An intimately mixed solution of the above components a-e was applied onto the film so as to give a final coating thickness of 8 microns by means of a bar-coater, then "Iso Par E" was removed by drying, followed by curing at 160° C. for 10 minutes.

A conductive agent was applied to the back of the film thus obtained to adjust the electric resistance to $10^4 \sim 10^9 \Omega cm$, and then the film was attached to an electrostatic transfer type copier "Minolta EG-7" to form a toner image thereon. The toner was a wet toner using an acrylic copolymer with vinyl monomer designed to enhance its adhesion to the coated surface of the film.

Then, retouching of the image, dot etching and application of ink for the imaged film thus obtained were performed in the same way as in Example 1. As a result, it was found that retouching of the image and dot etching were applicable and that there could be obtained a graphic arts film having an image area of a remarkably enhanced optical density and free from background contamination.

What is claimed is:

1. A graphic arts film having an image thereon created by electrophotography, said film comprising;
   (a) a light transmitting base sheet having a light transmittance of not less than 70%,
   (b) a toner-adhesive and ink-repellent, transparent coating layer formed from an elastomeric silicon resin, said layer being formed on said base sheet,
   (c) a toner bonded imagewise onto said transparent coating layer by electrophotography, with the contrast between said nonimaged base sheet and said image defined by said toner being enhanced by,
   (d) a permanently cured ink layer formed selectively on only the toner image area, wherein the combined optical density of the image area on the film with said ink layer adhered thereto is not lower than 2.5.

2. The graphic arts film of claim 1, wherein said elastomeric silicone resin comprising a mixture of:
   (A) an organopolysiloxane;
   (B) an alkoxy silane represented by the formula $R_{4-a-b}R'_aSi(OR'')_b$ wherein R is an organic group having 1 to 18 carbon atoms which contains a member selected from the group consisting of an olefinically unsaturated hydrocarbon group, an aromatic hydrocarbon group and a polar group which does not react with the OR" at room temperature, R' is an alkyl or alicyclic group having 1 to 18 carbon atoms, OR" is an alkoxy group having 1 to 8 carbon atoms, a is 0 or 1, b is 2 or 3, and a+b is at most 3; and
   (C) a titanium or a zirconium compound represented by the formula $(R^1O)(R^2O)(R^3O)(R^4O)M$ wherein $R^1$, $R^2$, $R^3$, $R^4$ are each an organic group having 1 to 18 carbon atoms or an organic group having 1 to 18 carbon atoms containing a residue of

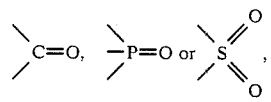

by which the group is bonded to the oxygen atom, and M is titanium or zirconium.

3. The graphic arts film of claim 1, wherein the optical density of the image area on the film with said ink layer adhered thereto is not lower than 3.0.

4. An imaged graphic arts film formed by the process of:
  (a) forming an image with electrophotography on a light transmitting base sheet having an ink repellent, toner adhesive resin layer formed thereon, said light transmitting base sheet having a light transmittance of not less than 70%,
  (b) selectively bonding a toner to said coated base sheet to define an image thereon,
  (c) coating said coated base sheet with an ink layer, to cause the ink to selectively adhere to only the toner image area and thereby enhance the contrast between said non-imaged base sheet and said imaged area,
  (d) permanently curing said ink and said toner to create a graphic arts film having an optical density not lower than 2.5 in said image area and a light transmittance of not less than 70% in said transparent non-image area.

5. The graphic arts film of claim 1 or 4, wherein said light-transmitting base sheet comprises at least one member selected from the group consisting of polyester films, polyamide films, polyolefin films and cellulosic films.

6. The graphic arts film of claim 1 or 4, wherein said elastomeric silicone resin contains at least one member selected from the group consisting of O, N, S, P elements, metal elements, aromatic rings having not more than 18 carbon atoms and heterocyclic rings having not more than 18 carbon atoms, other than -Si-O-bond.

7. The graphic arts film of claim 1 or 4, wherein said transparent coating layer has a toner bonding strength of not less than 20 g/cm 8. The graphic arts film of claim 1 or 4, wherein said transparent coating layer has a thickness in the range of 0.1 to 100 microns.

9. The graphic arts film of claim 1 or 4, wherein the toner image comprises toners having an average particle size of not larger than 5 microns.

10. The graphic arts film of claim 1 or 4, wherein said toner comprises at least one member selected from the group consisting of modified epoxy resins and acrylic or methacrylic acid copolymers.

11. The graphic arts film of claim 1 or 4, wherein said ink layer has an average thickness in the range of 0.2 to 10 microns.

12. A method of preparing a graphic arts film, which method comprises:
  (a) forming an electrophotographic image on a toner-adhesive and ink-repellent, transparent coating layer of elastomeric silicon resin, said resin being coated on a light-transmitting base sheet having a light transmittance of not less than 70%,
  (b) bonding a toner imagewise onto said transparent coating layer,
  (c) applying ink onto the imaged sheet with said toner bonded thereto, and
  (d) permanently curing the ink to thereby selectively enhance the optical density of the toner image area on said transparent coating layer to form a film wherein the optical density of the image area on the film with said ink layer adhered thereto is not lower than 2.5.

13. a method or process as claimed in claim 12 wherein said curing steps include heating the film to dry the ink coated on said toner.

14. A method or process as claimed in claim 12 wherein said curing step includes solidification of the ink with heat, infrared or UV radiation.

15. A method or process as claimed in claim 12 wherein said curing step includes a selection of an ink solvent that will permit the ink and toner to air dry to form an image of enhanced and even contrast free of pinhole defects.

16. A method or process as claimed in claim 12 wherein said curing step includes polymerization of the ink.

17. A method or process as claimed in claim 12 which further includes the step of retouching the image before the application of ink.

18. A method or process as claimed in claim 12 which further includes the step of retouching the image after the ink has been permanently cured by solvent removal of the toner and ink.

19. A method or process as claimed in claim 12 wherein the steps of forming an electrophotographic image includes an exposure step on a film having a photoconductive layer.

20. A method or process as claimed in claim 12 wherein the step of forming an electrophotographic image include the transfer of an electrostatic image.

* * * * *